*(12)* United States Patent
Wardlow et al.

(10) Patent No.: US 11,153,978 B2
(45) Date of Patent: Oct. 19, 2021

(54) ENCLOSURE FOR ELECTRONIC DISPLAY

(71) Applicants: William Glenn Wardlow, Bend, OR (US); Django Gary Wardlow, Bend, OR (US)

(72) Inventors: William Glenn Wardlow, Bend, OR (US); Django Gary Wardlow, Bend, OR (US)

( * ) Notice: Subject to any disclaimer, the term of this patent is extended or adjusted under 35 U.S.C. 154(b) by 0 days.

(21) Appl. No.: 16/560,818

(22) Filed: Sep. 4, 2019

(65) Prior Publication Data

US 2021/0068269 A1    Mar. 4, 2021

(51) Int. Cl.
*H05K 5/00* (2006.01)
*H05K 5/02* (2006.01)
*G06F 1/16* (2006.01)

(52) U.S. Cl.
CPC ......... *H05K 5/0017* (2013.01); *G06F 1/1656* (2013.01); *H05K 5/0213* (2013.01); *H05K 5/0239* (2013.01)

(58) Field of Classification Search
CPC .. H05K 5/0017; H05K 5/0213; H05K 5/0239; G06F 1/1656
See application file for complete search history.

(56) References Cited

U.S. PATENT DOCUMENTS

| | | | |
|---|---|---|---|
| 4,235,368 A * | 11/1980 | Neel | G05D 23/20 200/302.1 |
| D273,676 S * | 5/1984 | Itoh | D14/217 |
| D273,950 S * | 5/1984 | Itoh | D14/217 |
| D325,737 S * | 4/1992 | Ito | D14/217 |
| D340,931 S * | 11/1993 | Ito | D14/217 |
| 5,423,746 A * | 6/1995 | Burkett | A61M 5/16859 128/DIG. 13 |
| D367,052 S * | 2/1996 | Ito | D14/162 |
| 5,566,424 A * | 10/1996 | Crompton | G06F 1/1601 16/337 |
| 5,850,358 A * | 12/1998 | Danielson | G07C 5/0808 713/321 |
| D417,669 S * | 12/1999 | Ito | D14/217 |
| 6,926,130 B2 * | 8/2005 | Skowronski | H02G 11/02 191/12.2 R |
| 7,044,627 B2 * | 5/2006 | Mertz | G02B 6/002 362/555 |
| D565,031 S * | 3/2008 | Duncan Seil | D14/217 |
| 7,542,052 B2 * | 6/2009 | Solomon | G06F 1/1601 345/156 |
| 7,652,873 B2 * | 1/2010 | Lee | E05B 65/006 361/679.06 |
| D685,766 S * | 7/2013 | Olswang | D14/217 |
| D690,683 S * | 10/2013 | Olswang | D14/217 |
| 8,649,166 B2 * | 2/2014 | Wu | G06F 1/1626 361/679.27 |
| D715,266 S * | 10/2014 | Olswang | D14/217 |
| D720,724 S * | 1/2015 | Olswang | D14/217 |
| D721,675 S * | 1/2015 | Hong | D14/217 |
| 9,069,519 B1 * | 6/2015 | Hall | G06F 3/147 |
| 9,074,725 B2 * | 7/2015 | Trotsky | F16M 11/105 |
| D837,874 S * | 1/2019 | Sawada | D17/22 |

(Continued)

*Primary Examiner* — Jinhee J Lee
*Assistant Examiner* — Theron S Milliser

(57) ABSTRACT

An novel enclosure for a device featuring an encoder and an electronic display in which the cutouts, and dimensions of the surfaces and their relative angles provide a device that is compact, durable, and easy to see and operate.

8 Claims, 8 Drawing Sheets

(56) References Cited

U.S. PATENT DOCUMENTS

| | | | |
|---|---|---|---|
| 10,473,257 B2 * | 11/2019 | Tomomatsu | G06F 1/1622 |
| D872,171 S * | 1/2020 | Luo | D18/4.4 |
| 2006/0082958 A1 * | 4/2006 | Fujiwara | H05K 5/0017 |
| | | | 361/679.06 |
| 2006/0187626 A1 * | 8/2006 | Ditzik | G06F 1/1626 |
| | | | 361/679.05 |
| 2007/0002290 A1 * | 1/2007 | Muraki | G03G 21/1628 |
| | | | 353/119 |
| 2007/0280489 A1 * | 12/2007 | Roman | H04H 60/04 |
| | | | 381/119 |
| 2008/0186689 A1 * | 8/2008 | Koizumi | H05K 9/0064 |
| | | | 361/752 |
| 2009/0303676 A1 * | 12/2009 | Behar | G06F 16/9577 |
| | | | 361/679.27 |
| 2013/0182872 A1 * | 7/2013 | Olswang | H04H 60/04 |
| | | | 381/119 |
| 2017/0161704 A1 * | 6/2017 | Rimer | G07G 1/01 |

* cited by examiner

ENCLOSURE FOR ELECTRONIC DISPLAY

CROSS-REFERENCE TO RELATED APPLICATION

This application claims the benefit of Provisional Patent Application No. 62/728,342 filed on Sep. 7, 2018 by the present inventors.

BACKGROUND

The invention relates to enclosures for electronic devices featuring an encoder and an electronic display, and particularly to new and useful improvements therefor.

While numerous styles of enclosures for electronic devices exist, the present invention provides a novel configuration in which the cutouts, and dimensions of the surfaces and their relative angles have been carefully chosen to provide a device that is compact, durable, and easy to see and operate.

DRAWINGS—FIGURES

Figure 1A:
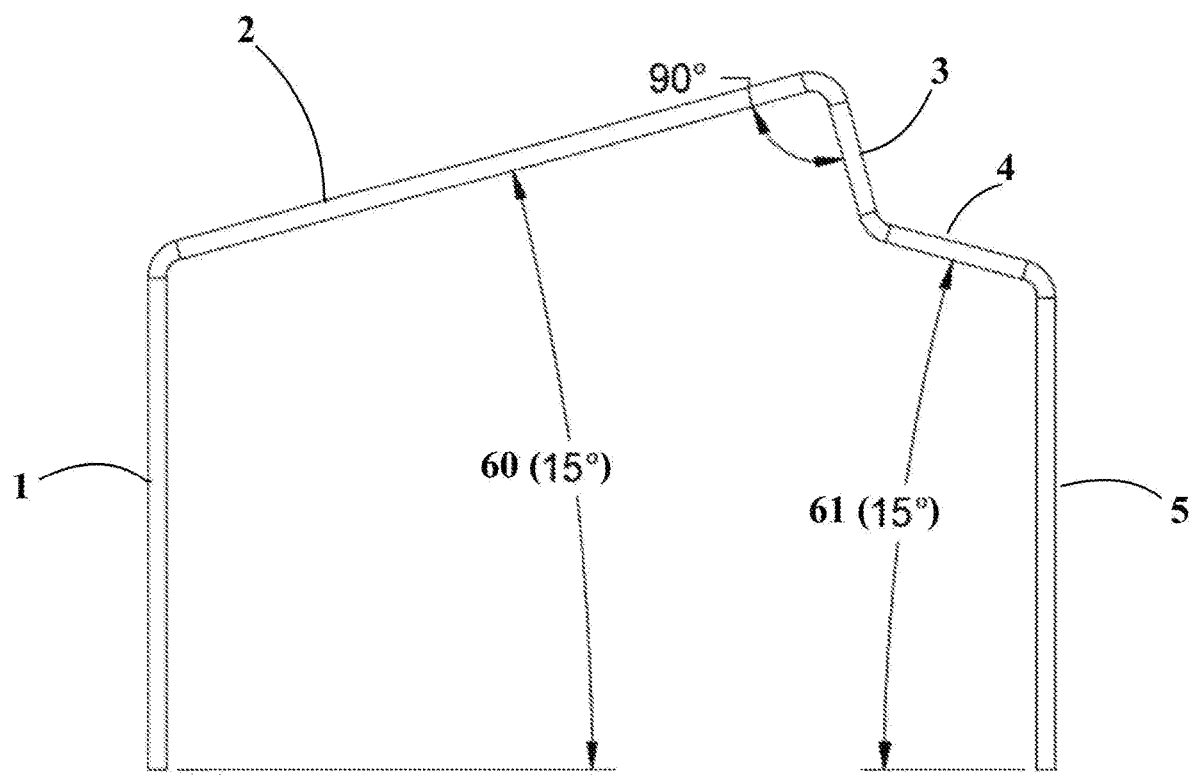
FIG. 1A is a simplified profile view of said top part and shows, inter alia, the angles used in the initial commercial embodiment.
Figure 1B:
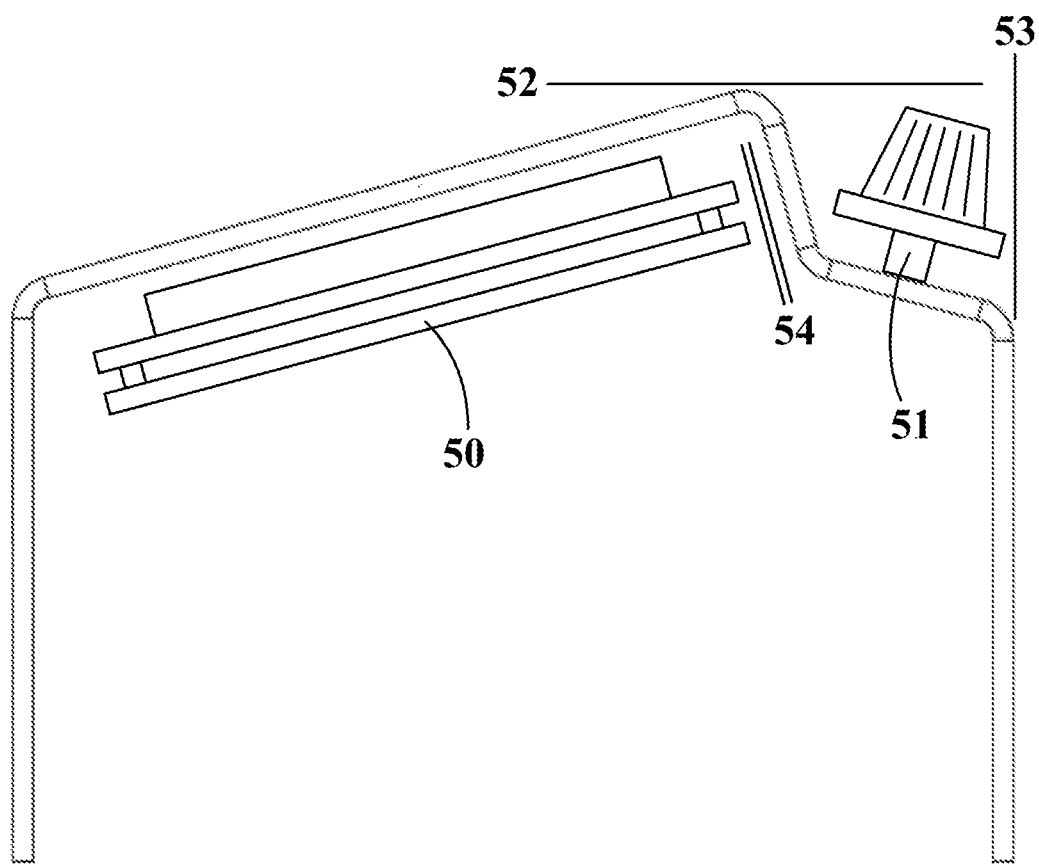
FIG. 1B is a simplified profile view of said top part and shows, inter alia, the relative positions of the electronic display assembly and the encoder with attached knob.
Figure 2:
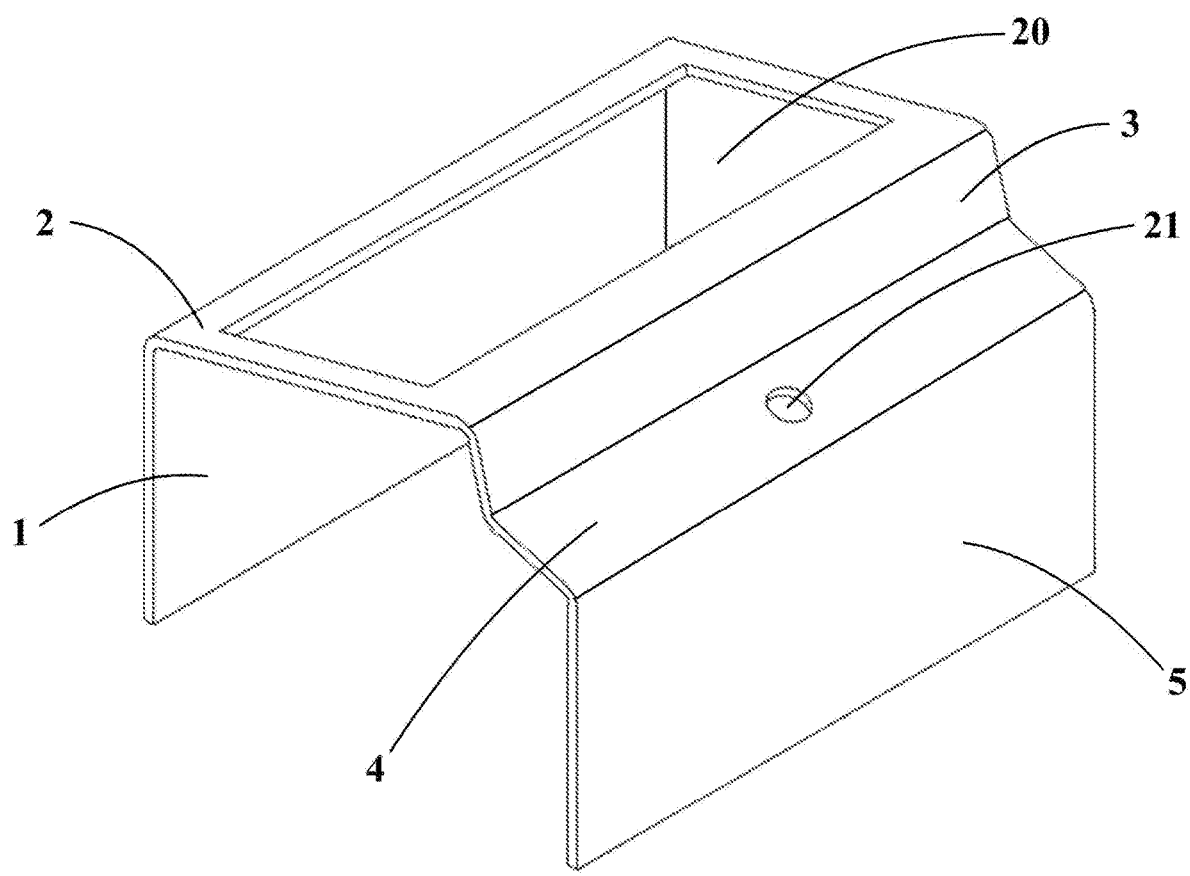
FIG. 2 is a simplified rear-facing perspective view of said top part and shows, inter alia, said opening for said electronic display as well as said hole or cutout for attaching said encoder.
Figure 3:
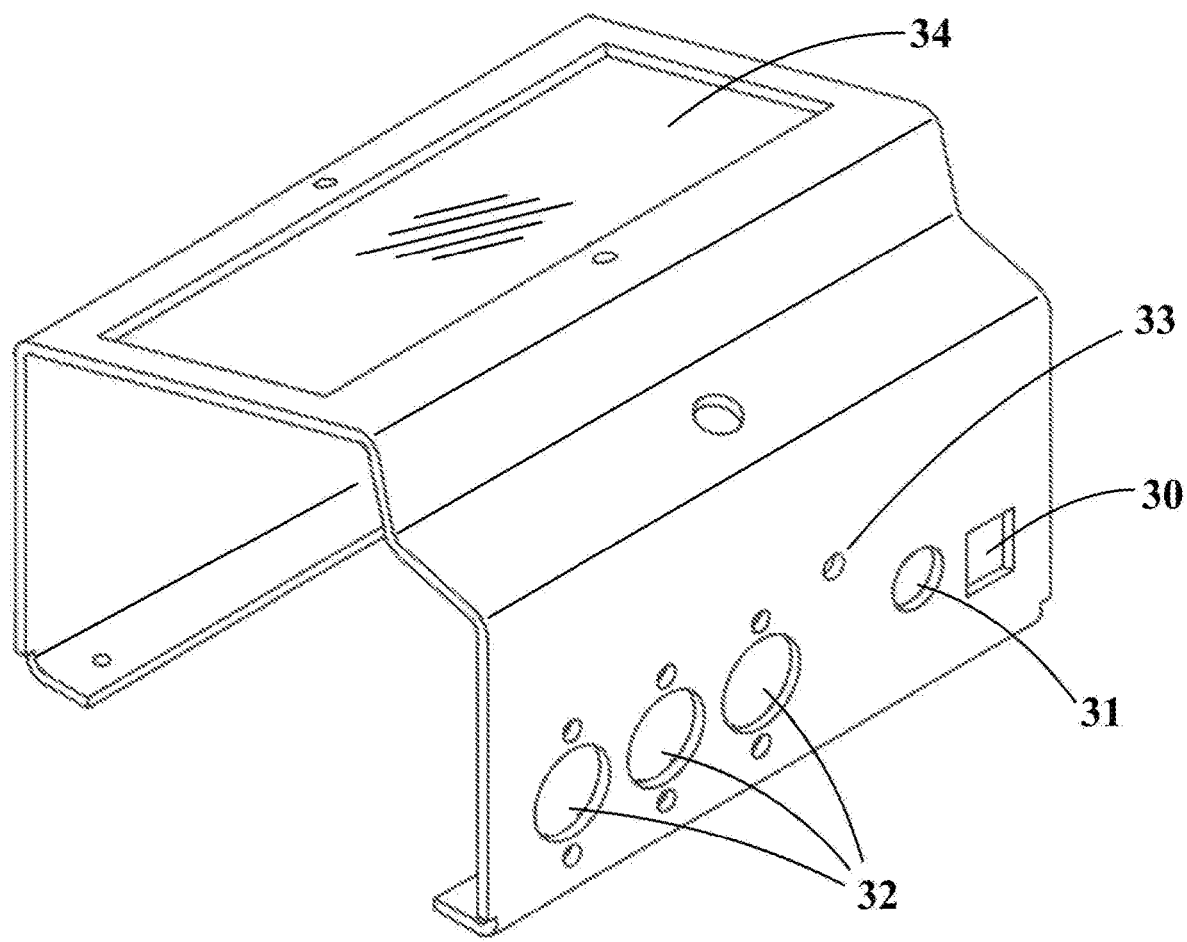
FIG. 3 is a rear-facing perspective view of said top part and includes holes, cutouts, and the protective lens used in said initial commercial embodiment
Figure 4:
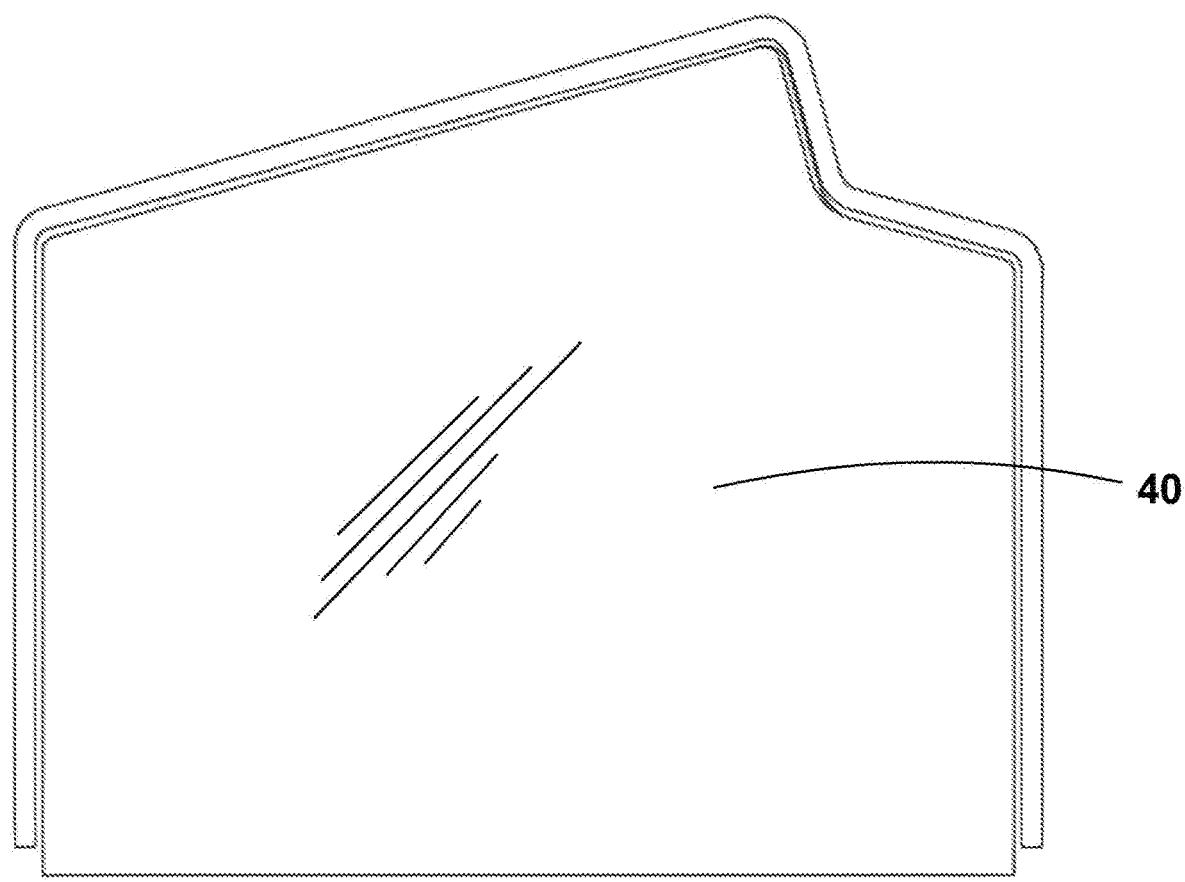
FIG. 4 is a simplified profile view which includes both said top part and said bottom part nested therein.
Figure 5:
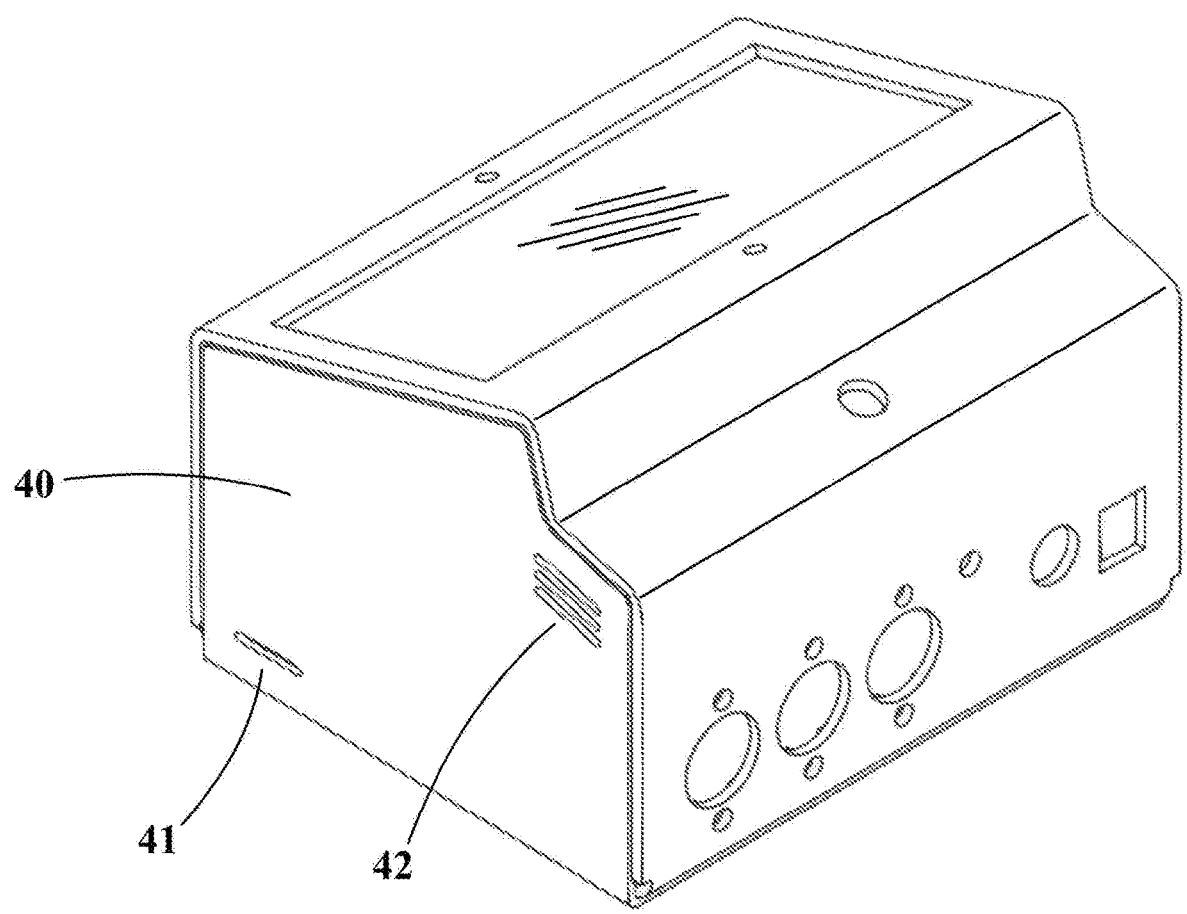
FIG. 5 is a rear-facing perspective view of said initial commercial embodiment which includes both said top part and said bottom part nested therein, as well as the ventilation slots used in said initial commercial embodiment.
Figure 6:
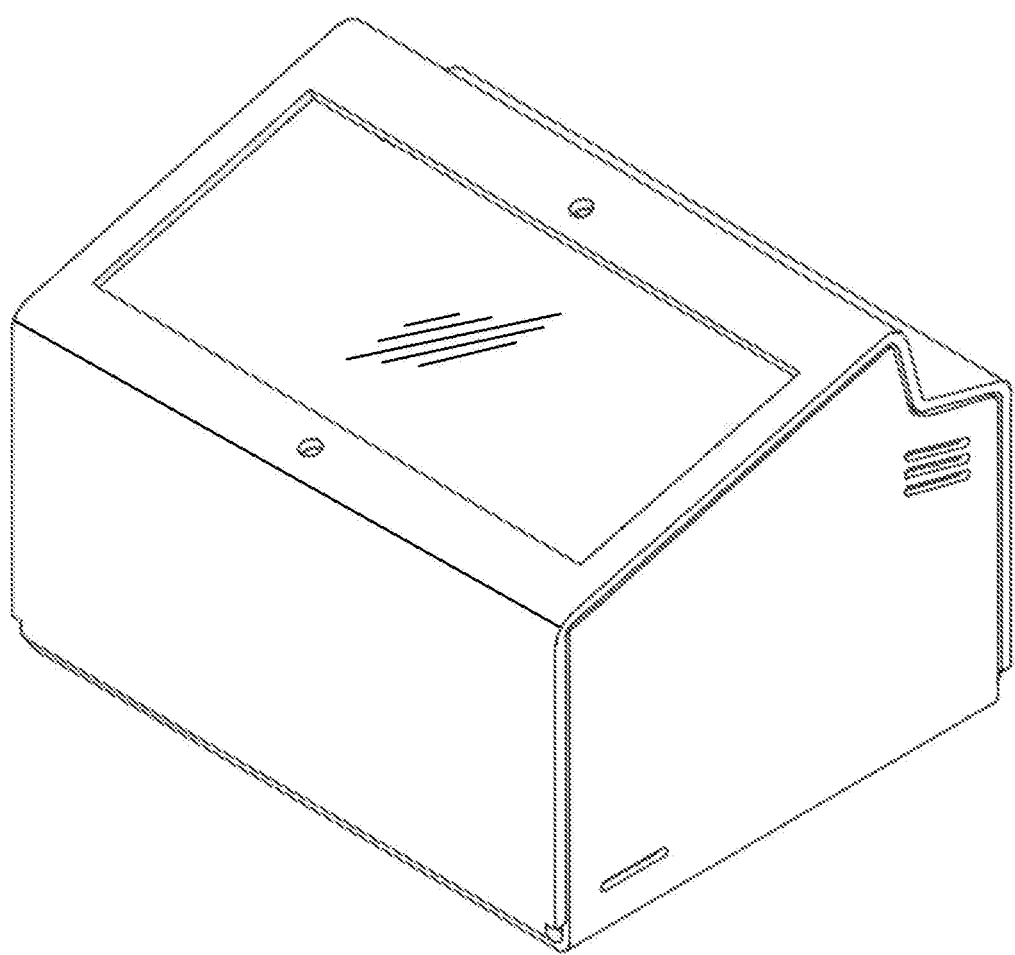
FIG. 6 is a front-facing perspective view of said initial commercial embodiment which includes both said top part and said bottom part nested therein.
Figure 7:
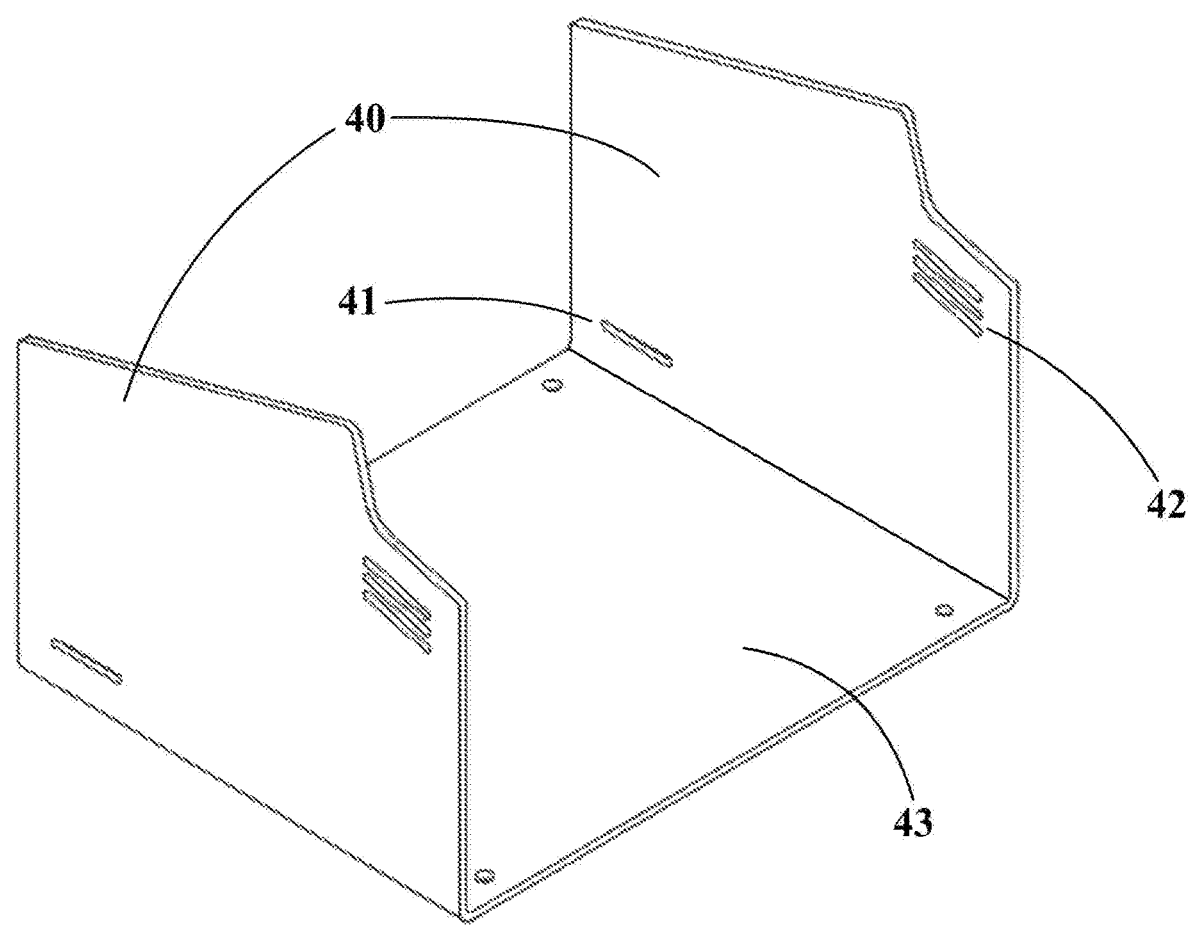
FIG. 7 is a perspective view of said bottom part as used in said initial commercial embodiment and includes, inter alia, said ventilation slots.

DRAWINGS—REFERENCE NUMERALS 1 front wall panel
2 display panel
3 third panel
4 encoder panel
5 back wall panel
20 opening for viewing an electronic display
21 hole or cutout for attaching said encoder
30 power jack cutout
31 ¼" jack hole
32 MIDI jacks holes
33 hole for attaching a voltage regulator
34 protective lens for electronic display
40 side panels
41 ventilation slot
42 ventilation slots
43 bottom panel
50 electronic display assembly
51 encoder with attached knob
52 line showing height of enclosure is greater than the top of the encoder with attached knob
53 line showing the encoder with attached knob does not cross the plane of the back wall panel
54 lines showing that the side of the electronic display assembly closest to the third panel is parallel thereto
60 angle of display panel relative to horizontal plane
61 angle of encoder panel relative to horizontal plane

DETAILED DESCRIPTION—INITIAL COMMERCIAL EMBODIMENT

The present invention is a novel enclosure for a device featuring an encoder and an electronic display whereby the top part of said enclosure comprises a vertical front wall panel (1), then bending upward from the top of said front wall panel to a display panel (2) which sits at an optimal viewing angle relative to the horizontal plane (60) and includes an opening for viewing said electronic display (20), then bending downward ninety degrees (90°) from said display panel to a third panel (3), which angle accommodates an electronic display assembly (50) within said enclosure such that the side of said electronic display assembly closest to said third panel is parallel thereto (shown by the lines labeled 54), then bending outward to an encoder panel (4) which sits at the mirror angle (61) of said display panel and includes a hole or cutout for attaching said encoder (21), with said hole at sufficient distance from said third panel so said encoder with attached knob (51) will not contact said third panel, and noting that said third panel is tall enough so that the tallest point of said enclosure is above the height of the top of said encoder with attached knob (shown by the line labeled 52), then bending vertically down to a back wall panel (5) which is parallel to said vertical front wall panel, noting that the length of said encoder panel is sufficiently long so that no part of said encoder with attached knob extends beyond said back wall panel (shown by the line labeled 53).

The overall distance between said front wall panel and said back wall panel has been minimized to achieve a compact design while accommodating said electronic display assembly and said encoder with attached knob.

The initial commercial embodiment utilizes a display panel angle of fifteen (15) degrees above horizontal (heretofore described as the "optimal viewing angle"), in order to accommodate users standing in front of the device when it resides near their feet. See FIG. 1A. That said, other alternative "optimal viewing angles" between 5 and 25 degrees may be determined based on the probable relative positions of the present invention and its user without affecting the utility of the present invention.

The initial commercial embodiment also includes a protective lens for said electronic display assembly (34).

The height of said third panel is chosen in order to minimize the chances of said encoder with attached knob coming into contact with objects from above, and to protect said encoder with attached knob from being inadvertently moved or damaged by such objects.

The length of said encoder panel is chosen in order to minimize the chances of said encoder with attached knob coming into contact with objects from behind, and to protect said encoder with attached knob from being inadvertently moved or damaged by such objects.

The angle of said encoder panel is chosen for its ergonomic utility relative to said encoder, as well as its structural rigidity and pleasing design symmetry. In the initial commercial embodiment, said hole or cutout for attaching said encoder is centered horizontally across said encoder panel when looking from the front of said enclosure, making said encoder equally accessible to right or left-handed users.

The height of said back wall panel is sufficient to allow for any other necessary jacks or components including, in the case of the initial commercial embodiment, power jack cutout (30), MIDI jacks mounting holes (32), a ¼" jack hole (31) and a hole for attaching a voltage regulator (33) which allows said enclosure to act as a heat sink.

The height of said front wall panel is determined as that which is necessary for the bottom of said front wall panel to reach the same horizontal plane as the bottom of said back wall panel.

Said enclosure also has a corresponding bottom part with a bottom panel (43) which creates the footprint for said enclosure, and two parallel side panels (40) bent 90 degrees upward therefrom which follow the contours of the profile of said top part allowing the sides of said bottom part to nest inside said top part, thereby completing said enclosure.

In the initial commercial embodiment, said bottom part has ventilation slots (41, 42) which allow air in and out of said enclosure in order to dissipate heat.

Because said top part has no joints, it is strong enough to withstand considerable shock. Furthermore, it has a smooth, attractive appearance.

The initial commercial embodiment uses the preferred version of said invention and is manufactured using sheets of steel which are laser cut then bent into shape. In addition to economic considerations, steel provides excellent structural rigidity and protection from EMI.

The initial commercial embodiment utilizes a single piece of sheet of metal for said top part, and a single piece for said bottom part. Said bottom part need not be formed by a single piece of metal, although it is in the initial commercial embodiment.

It should be noted that any number of other materials and methods of manufacture would prove suitable, including, but not limited to, aluminum.

CONCLUSIONS, RAMIFICATIONS, AND SCOPE

Thus the reader will see that at least one embodiment of the enclosure provides a novel and useful configuration in which the cutouts, and dimensions of the surfaces and their relative angles create a device that is compact, durable, and easy to see and operate.

We claim:

1. An enclosure for a device featuring an encoder and an electronic display comprising:
   a) a top part of said enclosure having a vertical front wall panel, then bending upward from the top of said front wall panel at an optimal viewing angle of between 5 and 25 degrees {relative to the horizontal plane} to a display panel which includes an opening for viewing an electronic display, then bending downward ninety degrees (90°) from said display panel to a third panel, which angle accommodates an electronic display assembly within said enclosure beneath said display panel, then bending outward at an angle which mirrors the angle of said display panel to an encoder panel, then bending vertically down to a back wall panel which is parallel to said front wall panel;
   b) a front wall panel height such that the bottom of said front wall panel reaches the same horizontal plane as the bottom of said back wall panel;
   c) a hole or cutout on said encoder panel for attaching said encoder at sufficient distance from said third panel so said encoder with attached knob will not contact said third panel;
   d) the third panel tall enough so that the tallest point of said enclosure is above the height of the top of said encoder with attached knob;
   e) the encoder panel sufficiently long so that no part of said encoder with attached knob extends beyond said back wall panel;
   f) a corresponding bottom part having a bottom panel which creates the footprint for said enclosure, and two parallel side panels bent 90 degrees upward from said bottom panel and which follow the contours of the profile of said top part allowing the sides of said bottom part to nest inside said top part, thereby completing said enclosure.

2. The enclosure of claim 1, wherein said hole or cutout for attaching said encoder is centered horizontally across said encoder panel when looking from the front of said enclosure, making said encoder equally accessible to right or left-handed users.

3. The enclosure of claim 1, wherein the height of said back wall panel is sufficient to allow for any other necessary jacks or components.

4. The enclosure of claim 1, wherein said back wall panel includes a hole for attaching a voltage regulator which allows said enclosure to act as a heat sink.

5. The enclosure of claim 1, wherein said bottom part has one or more ventilation slots which allow air in and out of said enclosure in order to dissipate heat.

6. The enclosure of claim 1, wherein a single piece of sheet of metal is used to create said top part.

7. The enclosure of claim 1, created using injection-molded plastic.

8. The enclosure of claim 1, wherein a protective lens for said electronic display assembly is attached to the bottom of said display panel.

* * * * *